Sept. 1, 1964 W. MICHAELSON 3,147,397

COMPENSATED VERTICAL SWEEP CIRCUIT

Filed Aug. 22, 1960

INVENTOR:
WILLIAM MICHAELSON,

BY Joseph Levinson
HIS ATTORNEY.

United States Patent Office 3,147,397
Patented Sept. 1, 1964

3,147,397

COMPENSATED VERTICAL SWEEP CIRCUIT

William Michaelson, Hasbrouck Heights, N.J., assignor to General Electric Company, a corporation of New York Filed Aug. 22, 1960, Ser. No. 50,947
7 Claims. (Cl. 315—27)

This invention relates to vertical sweep circuitry and, more particularly, relates to a compensated transistorized vertical sweep circuit for a television receiver.

It has been desired to drive the vertical deflection yoke from a low voltage (e.g., 12 volts) supply using transistorized circuitry for generation of the sweep sawtooth. The lower power dissipation of the transistor sweep circuit would be advantageous for such applications as portable TV sets.

It has been known that a low impedance yoke could be successfully employed to generate the necessary vertical deflection field. However, with a low voltage power supply, straight forward driving circuitry cannot be used to excite the yoke.

The output transistor must inject a linear sawtooth current waveform into the deflection yoke in response to a driving waveform. Due to practical considerations, the output transistor must be operated in the grounded-emitter configuration.

For example, if the grounded base configuration were employed in the power output stage, the entire peak current required for the vertical deflection field must be supplied by the transistor which is used to drive the power output stage since the current gain of the power stage configuration is slightly less than one. If current amplification were obtained in the output stage, such as by grounded emitter or grounded collector configuration, a signal-type transistor could be employed to drive the power stage. The grounded collector configuration is precluded in such applications where the supply voltage is of the order of 12 volts because the input impedance to the grounded collector is high. At the frequencies of interest, the impedance of the grounded collector configuration is approximately equal to the inherent resistance of the transistor looking into the base plus the unbypassed impedance multiplied by the current amplification factor $h_{fe}$ (formerly identified by the symbol Beta). Due to the high input impedance, the peak-to-peak sawtooth voltage requirement inevitably exceeds the battery supply voltage.

Operation of the power stage in the grounded emitter configuration will be satisfactory. Current amplification is achieved and the magnitude of the driving sawtooth voltage to be applied to the base of the output transistor would be low because of the relatively low input impedance of the grounded emitter configuration and would be obtainable from a battery supply.

Unfortunately, the current amplification factor, $h_{fe}$, of the grounded emitter configuration is non-linear under large signal condition. Therefore, the injection into the base of a grounded emitter transistor of a sawtooth of current which drove the transistor over its complete dynamic range would result in a flow of collector current which was highly non-linear. The non-linearity of the current waveform in the deflection yoke would, of course, result in an unacceptable non-linear scan.

It is therefore, one object of this invention to provide a positive feedback network to compensate for the non-linearity of the current amplification factor of a power transistor when operated over a wide dynamic range in the grounded emitter configuration.

It is a still further object of this invention to provide a transistor circuit for generation of vertical sweep fields in which the transistor characteristics are compensated by wave-shaping networks to obtain a linear output in a grounded emitter configuration despite operation over a wide dynamic range.

In accordance with these objects there is provided, in a preferred embodiment of this invention, a free running square wave generator synchronized at field frequency. The generator output is integrated to supply a recurrent sawtooth waveform. The sawtooth waveform is employed to drive a power output transistor coupled in the grounded emitter configuration. The power transistor drives the vertical deflection yoke serially coupled in the collector circuit. The current amplification factor of the output transistor is non-linear due to the wide dynamic range over which the transistor is driven in such applications.

To compensate for the transistor non-linearity, a wave-shaping network is provided between the integrator and the output stage. The wave-shaping network distorts the sawtooth waveform to compensate for the non-linearity of the output stage, providing a linear sawtooth output through the deflection yoke.

When the output transistor is driven from cut off during the trace, the distortion of the sawtooth applied to its base is such as to provide a waveform having an increasing slope with time. When the output transistor is driven toward cut off during the trace, the distortion of the sawtooth applied to its base is such as to provide a waveform having a decrease of slope with time. An intermediate power amplifier is provided for amplification of the shaped waveform before application to the base electrode of the output transistor and for the purpose of isolating the shaping network from the low input impedance of the output transistor.

In addition to shaping of the input waveform, I have found it advantageous to compensate the output power transistor for change of the current amplification factor as the transistor is driven over the wide dynamic range required by this application. Compensation is provided by a feedback network to selectively provide positive feedback between collector and base in the operating range at which the current amplification factor falls off. The feedback loop preferably includes the intermediate power amplifier. The feedback network includes a diode to selectively apply the positive feedback voltage as the $h_{fe}$ falls off. The diode may be selectively biased to control the time of providing positive feedback coupling. To prevent discontinuity in overall amplification, a small amount of positive feedback may be provided by a resistor shunting the diode.

This invention will be more clearly understood by reference to the following description taken in combination with the accompanying drawing, of which:

Figure 1:
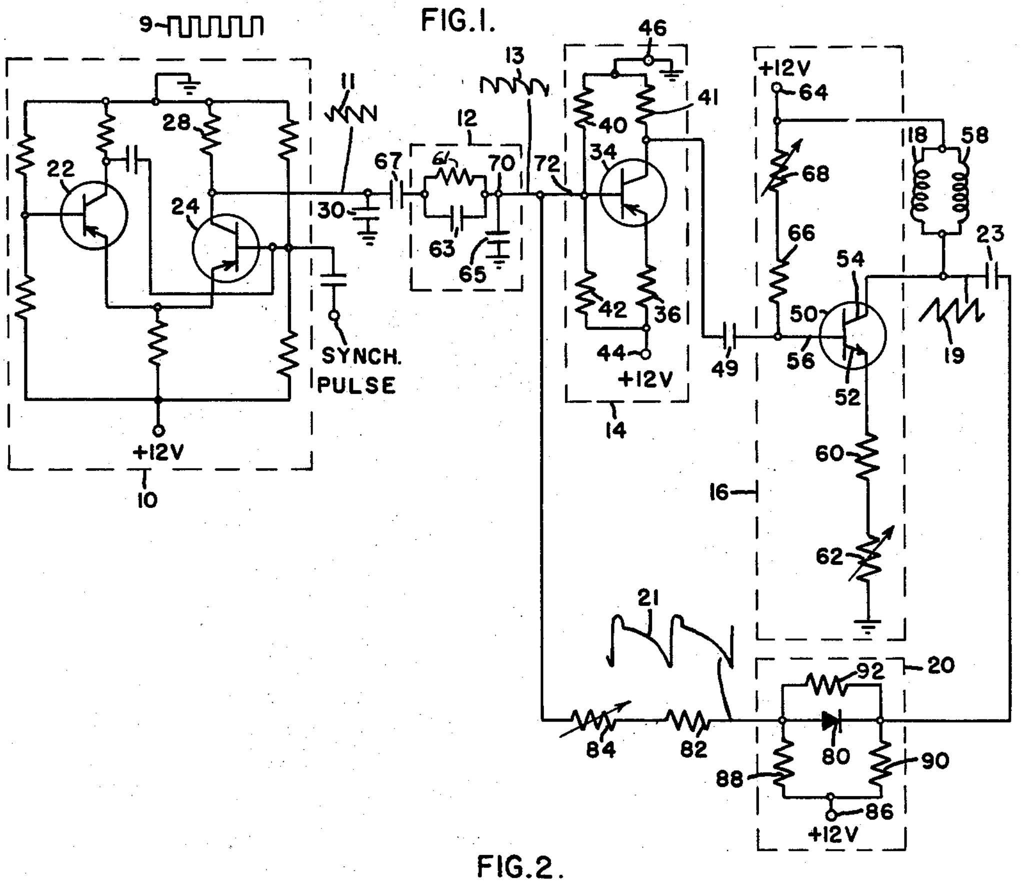
FIG. 1 is a schematic diagram of one embodiment of this invention.

Referring to FIG. 1, there is shown a square wave generator 10, comprising a conventional free running multivibrator synchronized at the field frequency by feeding the sync pulse to the base of transistor 24. The output (shown as waveform 9) from the multivibrator is integrated by the RC network 28, 30 to give a negative going sawtooth (shown as waveform 11) and the sawtooth is fed to a shaping network 12 for shaping of the waveform. The shaped waveform 13 is amplified by an intermediate power amplifier 14 and fed to the power output stage 16. The output stage provides further current amplification to drive the low impedance yoke coil 18 with a linear deflection sawtooth (shown as waveform 19). A feedback network 20 is provided to selectively feed back a regenerative voltage waveform 21 to compensate for the nonlinearity of the $h_{fe}$ of the transistor 50. Capacitive coupling between the integrator and shaping network and between the output and driver amplifier 34 is provided by capacitor 67 and 49 respectively.

Dealing with the components in detail, the oscillator is a conventional emitter-coupled, free-running multivibrator comprising transistors 22 and 24. Since the circuitry is conventional, no further explanation of the details thereof will be made. The vertical sync pulse is applied to the base of transistor 24 to lock the multivibrator to the field frequency. As is shown by waveform 9 the multivibrator will produce a plurality of rectangular pulses. The pulses are integrated by the RC circuit consisting of resistor 28 and capacitor 30 to provide a negative going sawtooth voltage 11 which is employed to drive the subsequent stages of the vertical sweep circuit.

It will be noted that the sawtooth could be employed to drive the output stage 16 directly if the output stage had a linear current amplification factor and a high input impedance. As explained above, the output stage is non-linear over the operating range. For this reason the waveform is preferably shaped by network 12.

In addition, the output linearity of the integrator stage is good as long as the discharge capacitor 30 is not loaded down by subsequent circuitry. For this reason, I have found it advisable to couple the waveform through an intermediate power amplifier 14 before application of the waveform to the low impedance input of the output transistor stage 16.

The intermediate power amplifier comprises a PNP transistor 34 coupled in the grounded emitter configuration with an unbypassed emitter resistor 36 for temperature and gain stabilization. Bias for the base electrode is provided by the voltage divider comprising resistors 40, 42 extending between the 12-volt supply applied at terminal 44 and ground applied at terminal 46 to provide additional temperature stabilization. The amplifier was biased for linear operation over the anticipated operating range. The configuration used provided a sufficiently high input impedance to avoid loading down the integrator and shaping networks while still providing sufficient output current capacity to properly drive the output stage transistor.

The output stage 16 comprises an NPN power transistor 50 operated in the grounded emitter configuration. The transistor has an emitter electrode 52, collector electrode 54 and a base electrode 56. The power transistor is coupled in the grounded emitter configuration with an unbypassed emitter resistance consisting of fixed resistor 60 and variable resistor 62. The variable resistor permits adjustment in size of the picture by varying the current gain by emitter degeneration. The low impedance deflection yoke is coupled between the positive bias applied to terminal 64 and the collector 54. Fixed resistor 66 and variable resistor 68 are coupled between the base electrode 56 and the positive bias. The adjustable resistor allows convenient change of the biasing point.

The yoke 18 is paralleled by a choke 58 to provide essentially a 1:1 auto-transformer feed for the choke. By such arrangement elimination of high biasing current through the yoke is achieved without deleterious effect upon the variable current swing through the yoke during generation of the vertical deflection field. Choke feeding does not, of course, completely eliminate the biasing current, but it does decrease it to a point where the picture can be centered by means of centering controls mounted on the cathode ray tube. If the entire biasing current were allowed to flow through the yoke, it might result in decentering of the picture beyond the range capable of adjustment through use of a centering control on the cathode ray tube.

If the input sawtooth 11 were used to drive the output stage after amplification by the power amplifier, variation in the $h_{fe}$ of the output stage would result in a non-linear sweep at field frequencies. The wave shaping network shapes the input wave to compensate for variation in $h_{fe}$.

The wave shaping network, comprising the paralleled resistor 61 and capacitor 63, is serially coupled with capacitor 65. The shaping network is capacitively coupled to the integrator through capacitor 67 and the output from the network is obtained from the junction 70.

As shown in waveform 13, the output of the wave shaping network is a waveform having a slope which increases with time. The wave shaping network therefore compensates for the decreasing $h_{fe}$ with time of the output stage.

Further, additional compensation for non-linearity in the output stage by selectively applied positive feedback is provided. Regenerative feedback between the collector 54 and base 56 is provided by network 20 which is coupled between collector 54 and base electrode 72 of the intermediate amplifier to take advantage of the amplifier gain in the feedback loop.

In order to provide the selectivity of feedback, there is provided diode 80 which will selectively couple the regenerative feedback during the portion of the swing in which $h_{fe}$ drops off. The amount of feedback is controlled by resistor 82 and the linearity control variable resistor 84. Proper bias conditions are maintained by applying a positive 12 v. supply to terminal 86 which is coupled to both sides of diode 80 by resistors 88, 90.

Thus, the linearity of the current waveform through the deflection yoke may be controlled over the entire deflection swing by variation of the linearity control comprising the variable resistor 84. If the diode was allowed to control the feedback entirely, a discontinuity would be noticed in the vertical deflection field upon firing of the diode which discontinuity might be noticeable on the face of the picture tube. For this reason, it has been found desirable to couple a fixed resistor 92 across the diode thereby to feed back a small amplitude signal in regenerative fashion during the entire vertical deflection field generation. By such means current waveform shown by 19 can be achieved in which the linearity of the vertical deflection field is maintained through the entire deflection field swing.

For the purpose of full disclosure, but not by way of limitation of this invention, the component values of a specific circuit in accordance with the embodiment of this invention shown in FIGURE 1 is given in Table I.

*Table I*

| Component | Description |
|---|---|
| 18 | Yoke, 400 ma. current swing, 33 r. resistance, 30 mh. inductance. |
| 50 | Sylvania 2N–95 NPN Transistor (Power). |
| 34 | G.E. 2N–188A PNP Signal Transistor. |
| 80 | 1N87G diode. |
| 28 | Resistor 1.8K ohm. |
| 61 | Resistor 560. |
| 40 | Resistor 22K. |
| 42 | Res'stor 5.1K. |
| 41 | Res stor 270. |
| 36 | Resistor 43. |
| 60 | Resistor 5. |
| 62 | Resistor 4.7 (adj.). |
| 66 | Resistor 3K. |
| 68 | Resistor 2K (adj.). |
| 92 | Resistor 1.5K. |
| 82 | Resistor 1.5K. |
| 84 | Resistor 1K (adj.). |
| 88 | Resistor 2.7K. |
| 90 | Resistor 2.7K. |
| 30 | Capacitor 20 mfd. |
| 67 | Capacitor 100 mfd. |
| 63 | Capacitor 5 mfd. |
| 65 | Capacitor 5 mfd. |
| 49 | Capacitor 300 mfd. |
| 23 | Capacitor 100 mfd. |

The power dissipated in the entire system of the above configuration is 3.17 watts at 12 volts. The dissipation in the output power stage transistor 50 is 1.5 watts (well within the limits of such transistor) and in the yoke is 0.5 watt.

In the embodiment shown in FIG. 1, the power transistor is driven from cut off to maximum current during generation of the deflection field. The $h_{fe}$ of the transistor thus decreases during the sweep, for the correction of which the selective positive feedback circuit is provided. In some applications, it is desirable to provide a simpler circuit. In such applications the embodiment shown in FIG. 2 may advantageously be employed.

Figure 2:
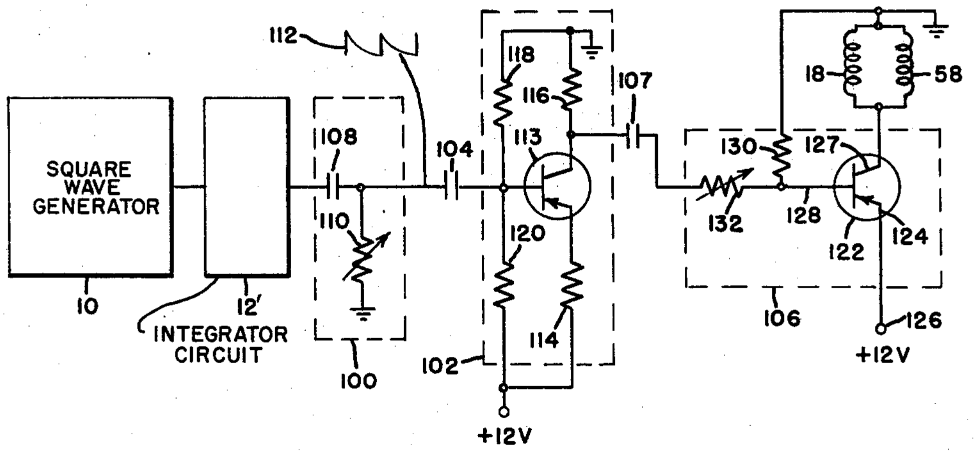
FIG. 2 is a schematic diagram of another embodiment of this invention.

In FIG. 2 there is shown the square wave generator 10 which feeds into an integrator 12 to provide a sawtooth waveform. In manner similar to the circuit of FIG. 1 the sawtooth is shaped by shaping network 100, amplified by the intermediate amplifier 102 capacitively coupled to the shaping network by capacitor 104, and applied to the power stage 106 capacitively coupled to the intermediate power amplifier by capacitor 107. The output stage supplies yoke 18 with deflection current. A choke 58 is parallel with the yoke as in FIG. 1.

However, in the circuit of FIG. 2 the output stage is biased at maximum output current and is driven to cut off during establishment of the trace. Therefore, the $h_{fe}$ of the output stage increases with time. The wave shaping network must provide a wave which has a decreasing slope with time for compensation.

Discussing the circuit element in detail, the wave shaping network comprises a capacitor 108 serially coupled with resistor 110. The shaped voltage is tapped from the top of the resistor. The network, fed by a sawtooth, will shape the waveform to provide a waveform 112 in which the slope decreases with time. To provide means for adjusting the waveform, resistor 110 is a variable resistor.

The intermediate or driver amplifier is a PNP transistor 113 coupled in the grounded emitter configuration having a stabilizing emitter resistor 114, a collector load resistor 116, and a stabilizing base bias voltage divider comprising resistors 118 and 120.

The power output stage is a PNP power transistor 122 coupled in the grounded emitter configuration. The transistor has an emitter 124 electrode coupled to terminal 126 to which 12 v. bias is applied, a collector electrode 127 coupled to ground through the yoke 18, and a base electrode 128 coupled to ground through resistor 130 and to the output of the intermediate amplifier through variable resistor 132 and capacitor 107. The variable resistor provides means for picture size adjustment.

The circuit is thus similar to the circuit shown in FIG. 1 if the feedback loop is omitted therefrom. However, the bias on the transistor stages is such as to maintain the current flow through the yoke high. The trace drives the power transistor to cut off. Since the $h_{fe}$ of the power transistor now increases with time during trace, and since the shaping to compensate is somewhat easier to accomplish, the circuit of FIG. 2 is often sufficient for linear deflection at field frequencies. A slight amount of compression at the center of the picture may be noted but such is tolerable in many applications.

Also, since the power transistor 122 is driven into saturation on retrace, fold over may be encountered. With a low impedance yoke, however, a large excursion of the flyback pulse is permitted before the transistor is driven into saturation. Thus, the retrace time is not lengthened enough to cause fold over.

Typical component values are given in Table II.

*Table II*

| Component | Description |
|---|---|
| 113 | G.E. 2N-188A PNP signal transistor. |
| 122 | Sylvania 2N-68 PNP power transistor. |
| 110 | Resistor 25K (adj.). |
| 120 | Resistor 12K. |
| 118 | Resistor 27K. |
| 116 | Resistor 270. |
| 114 | Resistor 75. |
| 132 | Resistor 200 (adj.). |
| 130 | Resistor 1.2K. |
| 108 | Capacitor 100 mfd. |
| 104 | Capacitor 100 mfd. |
| 107 | Capacitor 300 mfd. |

This invention may be variously modified and embodied within the scope of the subjoined claims.

What is claimed is:

1. A sweep circuit for providing a linear sawtooth current output waveform comprising:
   (A) an output power amplifier stage including a transistor having base, emitter and collector electrodes, a load circuit, a source of operating potential, and means coupling said transistor, said load circuit and said source of operating potential in a common emitter amplifier configuration;
   (B) a sawtooth voltage waveform source for providing a periodic sawtooth waveform having a linear trace component;
   (C) waveshaping means for providing a sawtooth waveform output voltage having a trace portion which is a nonlinear representation of a trace portion of a sawtooth waveform input voltage;
   (D) means for coupling a sawtooth waveform input voltage from said sawtooth waveform source to said waveshaping means;
   (E) means for coupling a sawtooth waveform output voltage from said waveshaping means to said base electrode of said transistor, and
   (F) a positive feedback network including a series coupled diode and capacitor coupled between said collector and base electrodes.

2. A sweep circuit for providing a linear sawtooth current output waveform comprising:
   (A) an output power amplifier stage including a transistor having base, emitter and collector electrodes, a load circuit, a source of operating potential, and means coupling said transistor, said load circuit and said source of operating potential in a common emitter amplifier configuration;
   (B) a sawtooth voltage waveform source for providing a periodic sawtooth waveform having a linear trace component;
   (C) means coupling a sawtooth voltage waveform from said sawtooth voltage waveform source to said base electrode, and
   (D) a positive feedback network including a series coupled diode and capacitor coupled between said collector and base electrodes.

3. The apparatus of claim 2 including an impedance coupled in parallel with said diode.

4. The apparatus of claim 2 including a resistor connected in parallel with said diode.

5. A sweep circuit for providing a linear sawtooth current output waveform comprising:
   (A) an output power amplifier stage including a transistor having base, emitter and collector electrodes, a load circuit including the impedance of a deflection yoke, a source of operating potential, and means coupling said transistor, said load circuit and said source of operating potential in a common emitter amplifier configuration;
   (B) an intermediate amplifier stage including a transistor having base, emitter and collector electrodes, means coupling said intermediate amplifying stage transistor in a common emitter amplifier configuration, and means coupling said collector electrode of said intermediate amplifier stage transistor to said base electrode of said output amplifier stage transistor;
   (C) a sawtooth voltage waveform source for providing a periodic sawtooth waveform having a linear trace component;
   (D) means for coupling a sawtooth voltage waveform from said sawtooth voltage waveform source to said base electrode of said intermediate amplifier stage transistor, and
   (E) a regenerative feedback network including a capacitor and diode connected in series, means coupling said capacitor to said collector electrode of said output amplifier stage transistor, means coupling said diode to said base electrode of said intermediate stage amplifier transistor, and means for reverse biasing said diode for a period of time during said trace portion of said sawtooth waveform.

6. A sweep circuit for providing a linear sawtooth current output waveform comprising:

(A) an output power amplifier stage including a transistor having base, emitter and collector electrodes, a load circuit, a source of operating potential, and means coupling said transistor, said load circuit and said source of operating potential in a common emitter amplifier configuration; and (B) circuit means for providing and coupling between said base and emitter electrodes a periodic signal of generally sawtooth waveform including a trace segment having a slope which decreases in value from initiation to termination of the trace segment and of a polarity for causing a collector current in said transistor to decrease from a relatively higher amplitude at initiation of the trace segment to a relatively lower amplitude at the termination of the trace segment.

7. A sweep circuit for providing a linear sawtooth current output waveform comprising:

(A) an output power amplifier stage including a transistor having base, emitter and collector electrodes, a load circuit, a source of operating potential, and means coupling said transistor, said load circuit and said source of operating potential in a common emitter amplifier configuration;

(B) a source of a periodic substantially linear sawtooth waveform having a trace segment;

(C) means for coupling said sawtooth waveform from said source to the base emitter electrodes of said output stage transistor, said last mentioned means including an intermediate amplifier and a sawtooth wave shaping network for modifying said sawtooth wave into a wave in which the slope decreases with time; and (D) said sawtooth waveform source adapted to provide a trace segment having a polarity for causing a collector current in said transistor to decrease from a relatively higher amplitude at initiation of the trace segment to a relatively lower amplitude at the termination of the trace segment.

References Cited in the file of this patent

UNITED STATES PATENTS

| | | |
|---|---|---|
| 2,876,297 | Keonjian | Mar. 3, 1959 |
| 2,887,542 | Blair | May 19, 1959 |

OTHER REFERENCES

Arguimbau: Vacuum-Tube Circuits and Transistors, New York, John Wiley & Sons, Inc., 1956, pp. 210–212.

Palmer et al.: IRE Transactions—Broadcast and Television Receivers, October 1957; "Transistorized Television Vertical Deflection System," page 104.